(12) United States Patent
Jastrzebski et al.

(10) Patent No.: US 12,703,909 B2
(45) Date of Patent: Aug. 11, 2026

(54) COATING DRUM AND SYSTEM FOR VAPOR DEPOSITION

(71) Applicant: Skycap Investment Holdings Inc., Toronto (CA)

(72) Inventors: Maciej Jastrzebski, Toronto (CA); Andrew Skoko, Toronto (CA)

(73) Assignee: Skycap Investment Holdings Inc., Toronto (CA)

( * ) Notice: Subject to any disclaimer, the term of this patent is extended or adjusted under 35 U.S.C. 154(b) by 0 days.

(21) Appl. No.: 18/329,374

(22) Filed: Jun. 5, 2023

(65) Prior Publication Data

US 2024/0401185 A1 Dec. 5, 2024

(51) Int. Cl.
*C23C 14/50* (2006.01)
*C23C 14/22* (2006.01)
*C23C 14/54* (2006.01)

(52) U.S. Cl.
CPC .......... *C23C 14/505* (2013.01); *C23C 14/228* (2013.01); *C23C 14/541* (2013.01)

(58) Field of Classification Search
CPC ... C23C 14/243; C23C 14/505; C23C 14/541; C23C 14/562; C23C 16/463; C23C 16/466; C23C 16/54; C23C 16/545
See application file for complete search history.

(56) References Cited

U.S. PATENT DOCUMENTS 3,818,982 A * 6/1974 Wagner .................. H01J 37/34 118/301
3,924,563 A 12/1975 Kessler
4,013,539 A * 3/1977 Kuehnle ............ H01J 37/3277 432/236
6,852,362 B2 2/2005 Nakayama
11,552,283 B2 1/2023 Sauer et al.
2004/0074443 A1* 4/2004 Madocks ............. C23C 14/562 118/718

(Continued)

OTHER PUBLICATIONS

Improvement of Web heat Condition by the deposition drum design; E. Yadin et al., 2007 Society of Vacuum Coaters 505/856-7188, 50th Annual Technical Conference Proceedings (2007) ISSN 0737-5921.

(Continued)

*Primary Examiner* — Parviz Hassanzadeh
*Assistant Examiner* — Nathan K Ford
(74) *Attorney, Agent, or Firm* — Marks & Clerk; Kevin Shipley

(57) ABSTRACT

A vapor deposition system includes a drum. The drum includes a generally cylindrical drum core. A process ring is fixedly disposed on the drum core at a position radially outward of the drum core. The process ring includes an inner face that extends radially, an outer face that extends radially opposite the inner face, and an outer-facing surface extending between the inner face and the outer face. The outer-facing surface has a plurality of axial channels formed therethrough. A plurality of fluid coolant passages extends through the process ring. An annular gas channel is in communication with the plurality of axial channels. A fluid conduit assembly is configured to supply a fluid coolant to the fluid coolant passages and a thermal coupling gas to the annular gas channel. The axial channels direct thermal coupling gas toward the substrate.

18 Claims, 4 Drawing Sheets

(56) References Cited

U.S. PATENT DOCUMENTS

| | | | |
|---|---|---|---|
| 2007/0026141 | A1 | 2/2007 | Nakayama |
| 2007/0077365 | A1 | 4/2007 | Nakayama |

OTHER PUBLICATIONS

Vacuum Heat Transfer Models for Web Substrates: Review of Theory and Experimental Heat Transfer Data, M. Roehrig et al., 2000 Society of Vacuum Coaters 505/856-7188, 43rd Annual Technical Conference Proceedings—Denver, Apr. 15-20, 2000 ISSN 0737-5921.

Web Coating with Lithium—Technical Solution for Metal Anode Structures in Li Batteries; R. Swisher et al., 2002 Society of Vacuum Coaters 505/856-7188, 45th Annual Technical Conference Proceedings (2002) ISSN 0737-5921.

International Search Report and Written Opinion dated Aug. 29, 2024 for PCT/CA2024/050747.

* cited by examiner

COATING DRUM AND SYSTEM FOR VAPOR DEPOSITION

FIELD OF THE INVENTION

The present invention is directed to systems for and methods of coating a substrate in a roll-to-roll vacuum deposition system.

BACKGROUND

Various techniques are known for deposition and/or coating of material on a substrate including, for example, chemical vapor deposition (CVD) and physical vapor deposition (PVD). For coating a flexible substrate at high deposition rates, thermal evaporation is commonly used in a PVD process. During thermal evaporation, a coating material is heated to produce a vapor that is deposited, for example, on a substrate supported on a coating drum, i.e., a rotatable cylindrical drum with a curved drum outer surface that is sized and shaped to support the web substrate.

The temperature of the vapor source influences the vapor concentration produced and increases of the temperature of the vapor source can facilitate increased deposition rates. For example, a coating material to be deposited on the substrate can be heated in a crucible or the like to produce vapor at an elevated vapor pressure. The vapor is directed from the crucible to contact a flexible web substrate on the drum to deposit the coating material on the flexible substrate. Further consideration is given to maintaining the web substrate at a temperature below the condensation temperature of the coating material to promote the deposition of the coating material thereupon.

Currently, conventional equipment typically relies on an intermediate coupling fluid between a cooled drum core and a process ring mounted on the drum. However, thermal contact between the drum, the process ring, and a substrate mounted on the process ring is very poor in vacuum. In normal contact resistance (not in a vacuum), there is direct conduction between interacting asperities, or "high points" on adjacent surfaces, and conduction through the gas present in the gaps between adjacent surfaces. In vacuum, the gaps are non-conductive, so thermal contact is very limited. This presents a challenge to effective cooling of the substrate.

In addition, such web substrates can be extremely fragile and are subject to stresses in current PVD devices, which can cause undesirable wrinkles, tears, or complete breakage of the web. It would be advantageous to provide for a vapor deposition apparatus including enhancements for cooling the web that both provides for a reduction in or elimination of the frequency of defects and/or failures of the web substrate, while promoting efficient and uniform deposition of coating material.

U.S. Pat. No. 11,552,283 discloses a method of coating a flexible substrate in a roll-to-roll deposition system wherein the position of a material deposited on a first side of the substrate is measured and the path of the substrate is controlled to deposit material in a desired position on a second side of the substrate opposite the first side. While the substrate is disclosed as being guided directly on the drum curved surface the disclosure does not appear to discuss cooling of any elements of the system.

SUMMARY

A first aspect of the invention is directed to a vapor deposition system that includes a drum. The drum includes a generally cylindrical drum core. A process ring is fixedly disposed on the drum core at a position radially outward of the drum core. The process ring includes an inner face that extends radially, an outer face that extends radially opposite the inner face, and an outer-facing surface extending between the inner face and the outer face. The outer-facing surface has a plurality of axial channels formed there through. A plurality of fluid coolant passages extends through the process ring. An annular gas channel is in communication with the plurality of axial channels. A fluid conduit assembly is configured to supply a fluid coolant to the fluid coolant passages and a thermal coupling gas to the annular gas channel.

A further aspect of the invention is a process for cooling a substrate in a physical vapor deposition system, including directing a substrate over a coating drum of the physical vapor deposition system, the coating drum comprising a rotatable drum core and a process ring supported by and attached to the drum core in a position that is radially outward of the drum core; passing a fluid coolant through the process core to cool the process ring; conducting a thermal coupling gas into the process ring; and directing the thermal coupling gas onto the substrate.

In accordance with at least one broad aspect of the teachings described herein, a drum for a vapor deposition system can include: a generally cylindrical drum core and a process ring fixedly disposed on the drum core at a position radially outward of the drum core. The process ring can include an inner face that extends radially, an outer face that extends radially opposite the inner face, and an outer-facing surface extending between the inner face and the outer face, the outer-facing surface comprising a plurality of axial channels formed therethrough. A plurality of fluid coolant passages may extend through the process ring. An annular gas channel may be in communication with the plurality of axial channels. A fluid conduit assembly may be configured to supply a fluid coolant to the fluid coolant passages and a thermal coupling gas to the annular gas channel.

In operation, when a substrate is wrapped about at least a portion of the drum core, the second coolant may exit from the axial channels and may be directed onto the substrate.

The outer-facing surface may extend from the outer face of the process ring axially to an inner face of the process ring.

An outer flange may be attached to the outer face of the process ring and to the drum core to attach the process ring to the drum core.

The outer flange and the outer face may define an outer fluid conduit therebetween.

The outer fluid conduit may be in fluid communication with the fluid conduit assembly and is configured to permit the fluid coolant to enter the fluid coolant passages.

An inner flange may be attached to the inner face of the process ring and to the drum core to attach the process ring to the drum core.

The inner flange and the inner face may define an inner fluid conduit therebetween.

The inner fluid conduit may be in fluid communication with the fluid coolant passages and is configured to permit the fluid coolant to exit the fluid coolant passages and return to the fluid conduit assembly.

The annular gas channel may be defined by the outer flange and the outer face of the process ring.

The annular gas channel may be configured to supply the thermal coupling gas to the plurality of axial channels.

Each of the axial channels may be a slot formed through the process ring and may be open to the radially outer-facing surface.

An outer flange may be attached to the outer face of the process ring and an inner flange may be attached to the inner face of the process ring.

The outer flange and the inner flange may both have a first diameter, and the process ring may have a second diameter. The first diameter may be greater that the second diameter.

The first diameter may be from about 0.001" to about 0.004" greater than the second diameter.

The first diameter may be about 0.002" greater than the second diameter.

In operation, when a substrate is wrapped about the drum core and is extended between the outer flange and the inner flange a gap may be formed between the substrate and the outer-facing surface that may be about 0.001" in depth.

The thermal coupling gas may be fed to the gap during operation.

The thermal coupling gas may include helium.

In accordance with another broad aspect of the teachings described herein there is a process for cooling a substrate in a physical vapor deposition system that may be used in combination with any of the embodiments of the drum(s) for a vapor deposition described herein, including a drum for a vapor deposition having some or all of the features described in this summary section and within the detailed description, as applicable. One example of such a process for cooling a substrate in a physical vapor deposition system can include the step of directing a substrate over a coating drum of the physical vapor deposition system. The coating drum may include a rotatable drum core and a process ring supported by and attached to the drum core in a position that is radially outward of the drum core. The process may include the additional steps of passing a cooling fluid through the process core to cool the process ring, conducting a thermal coupling gas into the process ring, and directing the thermal coupling gas onto the substrate. The coating drum used in the process may include any of the features of the drums described herein.

BRIEF DESCRIPTION OF THE FIGURES

For a more complete understanding of the disclosure, reference should be made to the following detailed description and accompanying drawing figures wherein.

Figure 1:
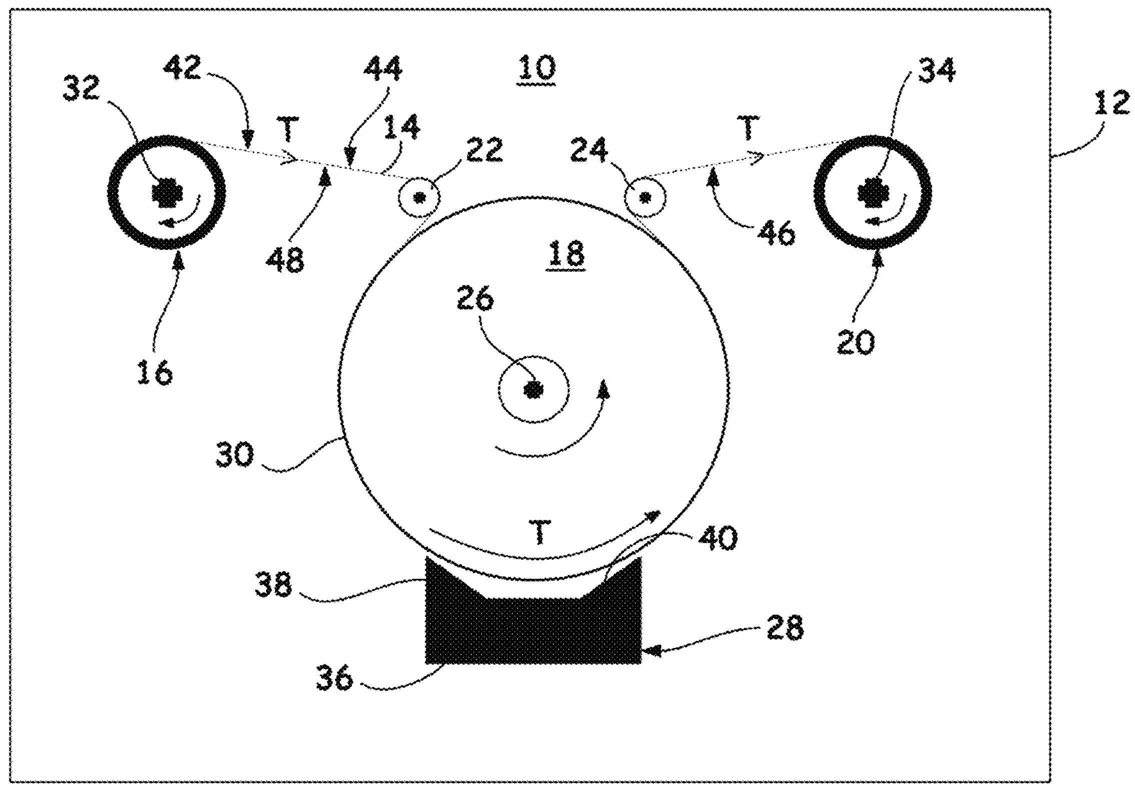
FIG. 1 is a schematic section view of a vapor deposition apparatus according to an aspect of the invention.

While specific embodiments are illustrated in the figures, with the understanding that the disclosure is intended to be illustrative, these embodiments are not intended to limit the invention described and illustrated herein.

DETAILED DESCRIPTION

Objects, features, and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

Herein, the use of the word "a" or "an" when used in conjunction with the term "comprising" in the claims and/or the specification may mean "one," but it is also consistent with the meaning of "one or more," "at least one," and "one or more than one." The term "about" means, in general, the stated value plus or minus 5%. The use of the term "or" in the claims is used to mean "and/or" unless explicitly indicated to refer to alternatives only or the alternative are mutually exclusive, although the disclosure supports a definition that refers to only alternatives and "and/or." Furthermore, the transitional phrase "consisting essentially of" limits a scope to the specified materials or steps and those that do not materially affect basic and novel characteristics. Also, the term "configured" will be used to refer to the shape and size of structural elements of devices disclosed herein.

Within the following description of the drawings, the same reference numbers refer to the same or similar components. Generally, only the differences with respect to the individual embodiments are described. Unless specified otherwise, the description of a part or aspect in one embodiment applies to a corresponding part or aspect in another embodiment as well. Also, for purposes of the disclosure, directional references, such as upper and lower, inner and outer, for example, will be set out and understood according to the orientation of the illustrated structures as depicted in the attached drawings and are not to be taken as limitations.

According to embodiments of the present disclosure, apparatuses, and methods for coating in a vacuum chamber are provided. For deposition onto a flexible substrate (also referred to herein as a "web" or "foil") with a coating material, the coating material may be heated inside a vapor source, e.g., inside a crucible of the vapor source, which is maintained above the evaporation temperature of the coating material. The evaporated material may then be guided by a distributor or chimney toward the flexible substrate.

The vapor deposition apparatus described herein includes a roll-to-roll (R2R) deposition system configured for coating web substrates. Roll-to-roll deposition systems use a web substrate which may be of a considerable length, such as hundreds of feet or more, which is drawn from a storage spool, also referred to as an unwind roll, coated with a layer or multiple thin layers while being supported on at least one coating drum, and typically re-coiled again on a wind-up spool or re-wind roll. In the manufacture of thin film batteries, the demand for roll-to-roll deposition systems is increasing. For example, lithium batteries, touch panel elements, flexible displays, and flexible PV modules generate an increasing demand for depositing layers in R2R-coaters.

FIG. 1 is a schematic section view of a vapor deposition apparatus 10 of an R2R-deposition system according to an embodiment, which shares some aspects thereof with typical such systems. The general construction of one such system will be described herein for context with the understanding that modifications known in the art may be made that contemplate use of the disclosed inventive aspects of an R2R-deposition system. The vapor deposition apparatus 10 disclosed herein may be configured to conduct any of the methods described herein.

The vapor deposition apparatus 10 includes a vacuum chamber 12 in which a plurality of wheels or rollers 22, 24 are disposed for guiding the flexible substrate 14 along a web transport path T from an unwind roll 16 to a coating drum 18. After the flexible substrate 14 passes over the coating drum 18 where it is coated on at least one side of the substrate, the flexible substrate may be wound on a re-wind roll 20.

The substrate 14 may be a flexible web such as a polymer or flexible foil, particularly a flexible metal foil, more particularly a copper foil or a copper-carrying foil. The substrate may have a thickness of 50 μm or less, particularly 20 μm or less, e.g., about 6 μm. In one embodiment, the substrate may be a thin copper foil having a thickness in a sub-20 μm range.

The vapor deposition apparatus 10 includes the unwind roll 16 for unwinding the flexible substrate 14 from the unwind roll 16 and the coating drum 18 which is arranged downstream of the unwind roll along the web transport path T. The tension and path of substrate 14 may be maintained, altered and/or guided by one or more unwind guide roller 22, 24, each of which is sized and shaped to direct the substrate from the unwind roll 16, onto the coating drum 18, and off of the drum. The unwinding guide roller 22 is arranged downstream from the unwind roll 16. The unwinding guide roller 24 is arranged downstream of drum 18. One or more of the guide rollers 22, 24 may incorporate a tensioner functionality as is known in the art to maintain a desired tension of the substrate or alter the tension as desired. One or more of the rollers 22, 24 may be passive rollers or active rollers for adjusting and/or maintaining tension, feed rates, wrap amount, and/or the position, lateral or otherwise, of the substrate 14 relative to the drum 18.

The vapor deposition apparatus 10 may be configured to accommodate and operate via mechanical and control devices (not shown) as is known in the art to move the flexible substrate 14 onto or adjacent to a curved drum surface 30 of the coating drum 18 past the at least one vapor source 28 or past a plurality of vapor sources, such that the flexible substrate is exposed to and can be coated with the evaporated material while being guided on and supported, at least in part, by the coating drum.

In one example, a roller drive 32 may be provided for driving the rotational movement of the unwind roll 16. The roller drive 32 may include an electric motor configured to rotate the unwind roll 16. Accordingly, the flexible substrate 14 can be wound from the unwind roll 16 and guided toward the coating drum 18 along the web transport path T, optionally over one, two or more further guiding rollers 22, 24. Further, the re-wind roll 20 may incorporate a wind-up drive 34 to draw the substrate 14 onto the re-wind roll. Further, the drum 18 itself may include a drum drive 26 to rotate the drum.

The vapor deposition apparatus 10 further includes at least one vapor source 28 configured to heat, direct, and enable the deposition of an evaporated material onto the flexible substrate 14. In some embodiments, the vapor source 28 includes a metal source, particularly a lithium source, and the vapor generated in the vapor source is a metal vapor, particularly a lithium vapor. The at least one vapor source 28 faces toward the coating drum 18, and the coating drum 18 is shaped and sized to guide the flexible substrate 14 past at least one vapor source 28.

In some embodiments, the at least one vapor source 28 may be heated to evaporate a metal, particularly a metal having an evaporation temperature of about 500° C. or more, particularly about 600° C. or more. In some implementations, the at least one vapor source 28 may be sized, shaped, and positioned to deposit a lithium layer on the substrate 14. The at least one vapor source 28 may include a crucible 36 heated to a temperature of about 600° C. or more, particularly 800° C. or more, and a chimney 38 shaped and sized to guide the vapor from the crucible 36 to the substrate 14. An inner volume of the chimney 38 can be heated to a temperature of about 600° C. or more, particularly 800° C. or more to discourage vapor from condensing on the chimney and to facilitate application of the material onto the substrate 14.

The evaporated material may be directed toward the flexible substrate 14 exiting from the chimney 38 through a coating window that is defined by an edge exclusion shield or mask 40 as is known that masks lateral edge areas of the flexible substrate not to be coated. The vapor deposition apparatus 10 may further include actively or passively heating the edge exclusion shield 40 to an operation temperature, particularly to a temperature of about 500° C. or more and about 600° C. or less for the same reason as heating the chimney 38. Specifically, the operation temperature of the edge exclusion shield may be slightly above the vapor condensation temperature, e.g., 10° C. or more and 50° C. or less above the vapor condensation temperature, to avoid an excessive heat load toward the substrate 14.

The vapor deposition apparatus 10 depicted in FIG. 1 allows, in one embodiment, the coating of a flexible substrate 14 having a first coating 42 on the first main side 44 thereof with a second coating 46. The second coating 46 may be deposited on the second main side 48 of the flexible substrate 14 opposite the first main side 44.

In some embodiments, which can be combined with other embodiments described herein, at least one of the first coating 42 and the second coating 46 is a metal coating, particularly a lithium coating, or may include a lithium-containing material. At least one of the first coating 42 and the second coating 46 may constitute an anode or form a part of an anode for the manufacture of a lithium battery. The deposition of a metal on a flexible substrate according to the present disclosure by evaporation may be used for the manufacture of batteries, such as Li-batteries. For example, a lithium layer may be deposited on a thin flexible substrate for producing the anode of a Li-battery. After assembly of the anode layer stack and the cathode layer stack, optionally with an electrolyte and/or separator therebetween, the manufactured layer arrangement may be rolled or otherwise stacked to produce the Li-battery.

Figure 2:
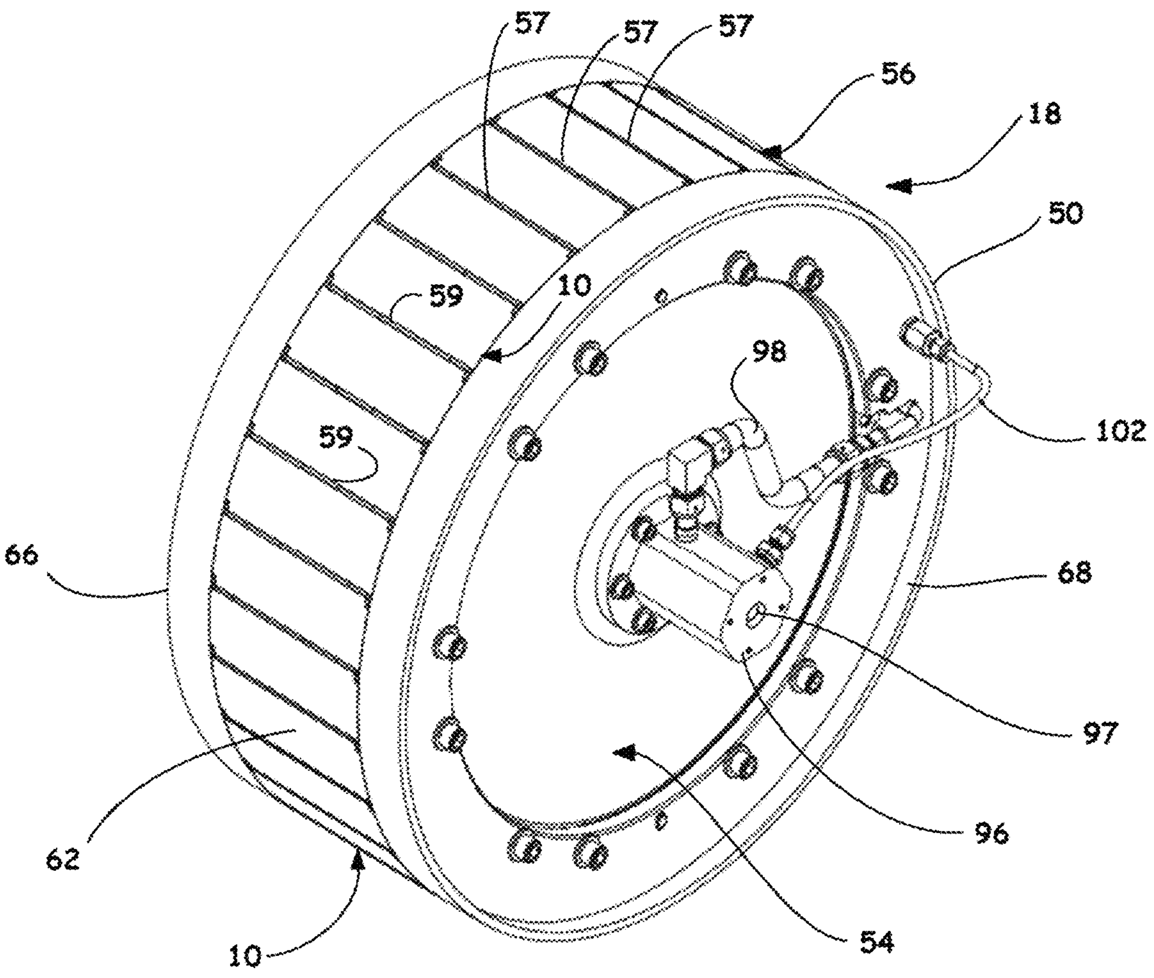
FIG. 2 is perspective view of a coating drum according to an aspect of the invention for a vapor deposition apparatus.
Figure 3:
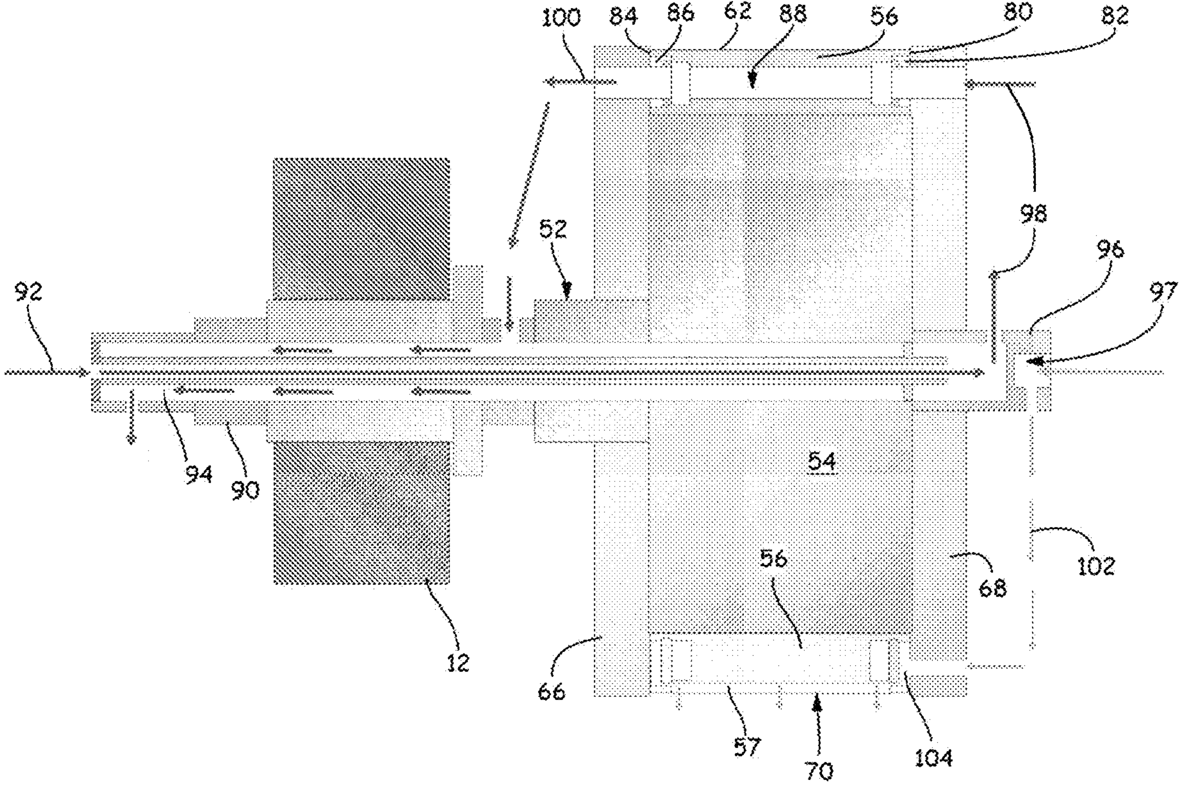
FIG. 3 is a cross section view of the coating drum of FIG. 2 including additional structures.

Turning to FIGS. 2-3 the drum 18 of the vapor deposition apparatus 10 includes a drum assembly 50 and a fluid delivery assembly 52. The drum assembly 50 is sized and shaped to support the substrate 14 (FIG. 1) thereupon. The fluid delivery assembly 52 may be configured to one or more of support the drum assembly, deliver thermal coupling fluid to the drum assembly, and collect thermal coupling fluid after being circulated through part of the drum assembly.

The drum assembly 50 may include a drum core 54 and a process ring 56 disposed radially outwardly on the drum core. The drum core 54 may be mounted to or disposed on the fluid delivery assembly 52 and is rotatable within the vacuum chamber 12 (FIG. 1) therewith.

The process ring 56 is disposed radially outboard of the drum core 54 and is carried by the drum core. The process ring 56 may be of a single-piece construction, and is generally an annular ring, which may be made of aluminum or copper, for example, and has a generally flat annular outer surface 62 which may have an axial length less than that of the width of the substrate 14. The copper or aluminum material of the process ring 56 enables an increase in the heat removal rate relative to stainless steel or steel. Furthermore, the process ring 56 may be coated with electroless nickel to provide inertness to lithium.

In one embodiment, process ring 56 is a separate piece that fits to the drum core 54. The fit of the process ring 56 to the drum core 54 may be an interference or press fit or some known means of fastening the two structures together, for example, by welding, fasteners, other structural members, and fasteners, and so on. It will be understood that the fastening of the process ring 56 to the core 54 will provide secure fixture of the two or more elements of the drum 18 together in view of the temperatures and other environmental conditions present. As will be explained herein, the drum core 54 itself is not cooled directly by a material provided to the drum core or an electrical or mechanical cooling device and, in this embodiment, it is not necessary to cool the drum core itself.

The process ring 56 includes a plurality of spaced apart axial channels 57 that are in fluid communication with the fluid delivery assembly 52 and configured to emit a coupling gas and direct the coupling gas onto the substrate from the fluid delivery assembly as will be explained in detail hereinbelow. The axial channels 57, in one embodiment, are elongate slots formed through the process ring 56 that are aligned generally axially relative to the drum 18. Configurations of channels 57 contemplated, include round holes, oval holes, rectangular holes, and other passage shapes and sizes.

The process ring 56 may be positioned between and fastened to an inner flange 66 and an outer flange 68. An annular outer face 80 of the process ring 56 abuts the outer flange 68 and when attached thereto defines an outer fluid conduit 82 that runs annularly about the circumference of the assembled process ring/outer flange. An annular inner face 84 of the process ring 56 abuts the inner flange 66 and when attached thereto defines an inner fluid conduit 86 that runs annularly about the circumference of the assembled process ring/inner flange. The process ring 56 may be attached to the drum core 54 in any suitable fashion.

A plurality of spaced fluid cooling conduits 88 are formed through and extend axially across process ring 56 to conduct fluid coolant from the outer fluid conduit 82 to the inner fluid conduit 86. In operation, coolant flowing through the fluid cooling conduits 88 acts to directly cool the process ring 56. The coolant may be a water/glycol mixture, for example, with other coolants being contemplated.

The fluid delivery assembly 52 includes a fluid conduit assembly 90 for supplying a coolant to the process ring 56 of the drum 18 and enabling the return of the coolant after being conducted through the process ring. The fluid conduit 90 may be constructed as a first conduit 92 for supplying the coolant to the process ring 56 and a second conduit 94 disposed concentrically about the first conduit for returning coolant from the process ring 56.

The fluid delivery assembly includes a distributor 96, which may be in the form of a manifold in fluid communication with the fluid conduit assembly 90. Coolant from the first conduit 92 of the fluid conduit assembly 90 enters the distributor 96. Coolant is distributed to the process ring 56 via a plurality of inlet pipes 98. From the inlet pipes 98 coolant enters the outer fluid conduit 82, travels around the circumference of the outer face 80 of the process ring 56, enters the fluid cooling conduits 88 and travels into the inner fluid conduit 86. From the inner fluid conduit, coolant enters a plurality of outlet ports 100 (FIG. 3) and is delivered to the second conduit 94. It will be understood that the coolant may travel from the outlet ports 100 to the second conduit 94 with conventional pipes or the like, which are not shown.

Returning to the arrangement of the drum elements, the radial diameter of the process ring 56 is configured to be less than the radial diameter of the inner flange 66 and the outer flange 68 such that a gap or channel 70 is defined with a radial depth of about 0.001 inch. In operation, the inner and outer edges of substrate 14 are supported by the flanges 66, 68. The substrate 14 extends over and across the axial length of the process ring 56 while being spaced apart from the outer surface 62 of the process ring a distance equal to the depth of the channel 70, i.e., about 25 microns in one example. The axial channels 57 are open to and in fluid communication with the channel 70.

In addition to conducting coolant through the process ring, the distributor 96 has a further function, which is to distribute a thermal coupling gas to the process ring 56 which, after the thermal coupling gas is directed to the process ring, is allowed to escape from the axial channels 57 of the process ring and is directed into the channel 70 and onto the side of the substrate on the drum 18 facing the outer surface 62, which, in FIG. 1, is indicated at reference character 44. The thermal coupling gas may be, for example, helium or neon, for example. Helium is a desirable gas in one example, due to its heat transfer properties, which is believed to be, in the environment disclosed, greater than about two times greater than other commonly used gases in existing PVD devices.

Figure 4:
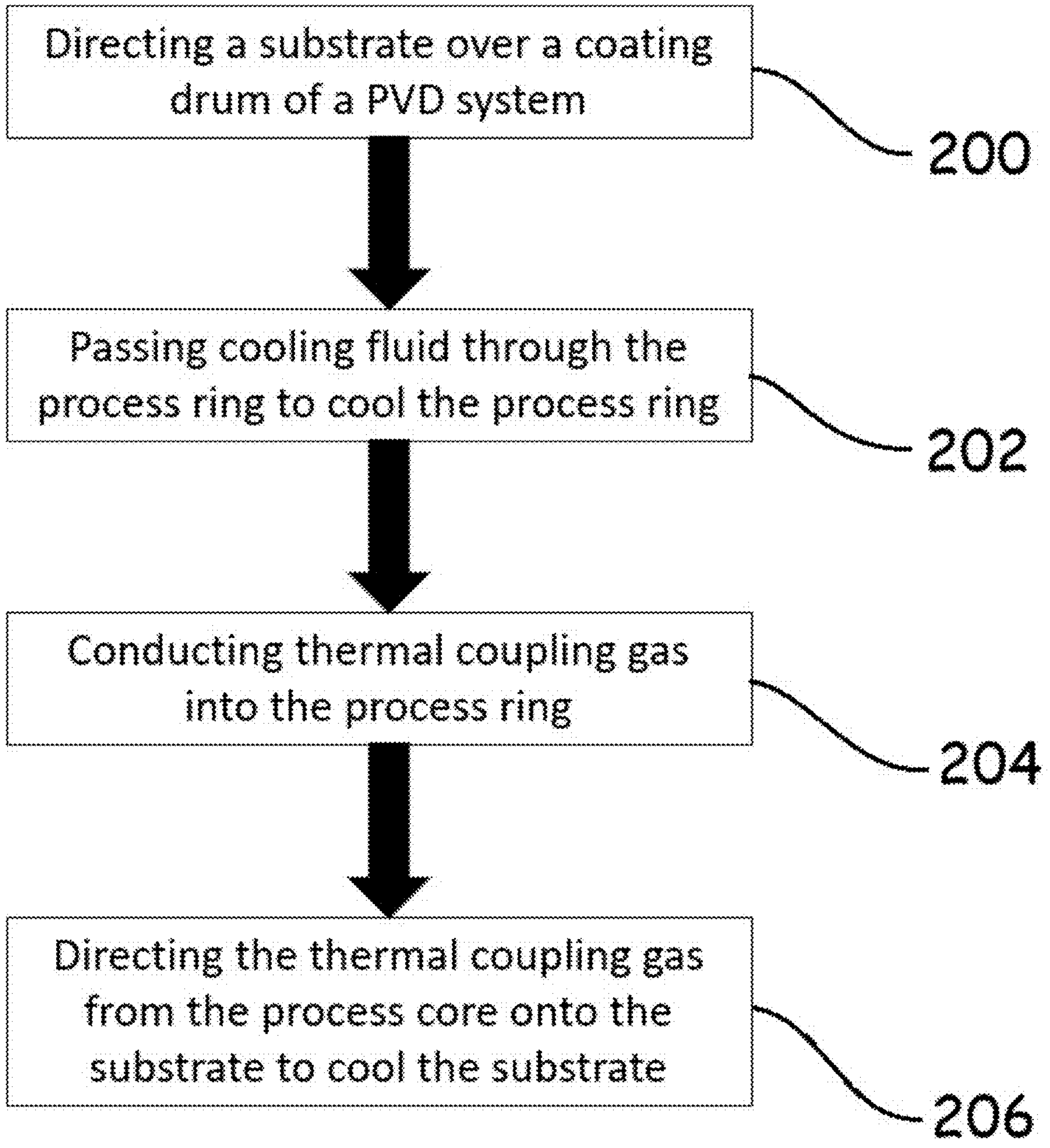
FIG. 4 is a flow chart of a process of using a vapor deposition apparatus according to an aspect of the invention.

Referring also to FIG. 4, the thermal coupling gas is supplied to the process ring 56 in a manner like that of the coolant. Distributor 96 is in communication with a source (not shown) of thermal coupling gas, the source being attached to a gas inlet 97 of the distributor. The thermal coupling gas is conveyed to the process ring 56 by a plurality of gas supply conduits 102 which permit thermal coupling gas to flow from the distributor to the process ring. A common annular gas channel 104 is formed in the process ring 56 that enables gas to travel about the process ring. The annular gas channel 104 is in communication with the plurality of axial channels 57 whereupon thermal coupling gas can be directed into channel 70 formed between the outer surface 62 of the process ring 56 and substrate 14 upon the drum 18. The thermal coupling gas in channel 70 engages substrate 14 with a degree of turbulent flow and couples the substrate thermally to the cooled drum, increasing heat transfer. The thermal coupling process enables coating deposited thereupon to cool at a rate greater than if the substrate and coating were merely being directed over the drum in the vacuum of vacuum chamber 12.

Thermal coupling gas escaping from channel 70 is scavenged and removed from vacuum chamber 12. The axial channels 57 may be slots with a given dimension for permitting the flow of thermal coupling gas at a given first rate. The dimension of the axial channels 57 may be modified to provide a second flow rate different than that of the first given rate by incorporating a shim or a gas flow rate modifier 59 into each of the plurality of the axial channels. The gas flow rate modifier 59 may include and/or be in the form of a leaf spring that, when installed, uses spring forces to bias and/or lock into a single channel 57, and it will be understood that a plurality of springs may be used, each occupying one of the channels to change the gas flow being emitted from respective ones of the channels.

FIG. 4 is a flow chart illustrating one method of operating a physical vapor deposition (PVD) apparatus according to an embodiment of the invention. The method is a process for cooling a substrate in a physical vapor deposition system. The method includes directing a substrate over a coating drum of the physical vapor deposition system (200). The coating drum includes a rotatable drum core and a process ring supported by and attached to the drum core in a position that is radially outward of the drum core. A fluid coolant is passed through the process ring (202) to cool the process ring. A thermal coupling gas is conducted into the process ring (204). The thermal coupling gas is directed from the process ring onto the substrate to cool the substrate (206). In particular, the thermal coupling gas is directed onto the side of the substrate that is positioned toward the process ring, i.e., the underside of the substrate or the face of the substrate facing the process ring when wrapped about the coating drum.

While the compositions and methods of this invention have been described in terms of preferred embodiments, it will be apparent to those of skill in the art that variations may be applied to the compositions and/or methods in the steps or in the sequence of steps of the method described herein without departing from the concept, spirit and scope of the invention. More specifically, it will be apparent that certain agents that are both chemically and physically related may be substituted for the agents described herein while the same or similar results would be achieved. All such similar substitutes and modifications apparent to those skilled in the art are deemed to be within the spirit, scope and concept of the invention as defined by the appended claims.

What is claimed:

1. A drum for a vapor deposition system, comprising:

a generally cylindrical drum core;

a process ring fixedly disposed on the drum core at a position radially outward of the drum core, the process ring including:

an inner face that extends radially, an outer face that extends radially opposite the inner face, and an outer-facing surface extending between the inner face and the outer face, the outer-facing surface comprising a plurality of axial channels formed therethrough, a plurality of fluid coolant passages that extend through the process ring, an annular gas channel in communication with the plurality of axial channels, an outer flange attached to the outer face of the process ring and to the drum core to attach the process ring to the drum core, the annular gas channel being defined by the outer flange and the outer face of the process ring, the annular gas channel being configured to supply a thermal coupling gas to the plurality of axial channels; and a fluid delivery assembly comprising:

a first conduit configured to supply a fluid coolant to a plurality of inlet pipes connected to the fluid coolant passages at the outer face of the process ring;

a second conduit for providing a return path for the fluid coolant; and a gas distributor configured to supply the thermal coupling gas from a gas inlet to a plurality of gas supply conduits connected to the annular gas channel, wherein the drum core is axially disposed on the fluid delivery assembly.

2. The drum of claim 1, wherein, in operation, when a substrate is wrapped about at least a portion of the drum core, the thermal coupling gas exits from the axial channels and is directed onto the substrate.

3. The drum of claim 1, wherein the outer-facing surface extends from the outer face of the process ring axially to an inner face of the process ring.

4. The drum of claim 1, further comprising an outer flange attached to the outer face of the process ring and to the drum core to attach the process ring to the drum core.

5. The drum of claim 4, wherein the outer flange and the outer face define an outer fluid conduit therebetween.

6. The drum of claim 5, wherein the outer fluid conduit is in fluid communication with the first conduit of the fluid delivery assembly and is configured to permit the fluid coolant to enter the fluid coolant passages.

7. The drum of claim 6, further comprising an inner flange attached to the inner face of the process ring and to the drum core to attach the process ring to the drum core.

8. The drum of claim 7, wherein the inner flange and the inner face define an inner fluid conduit therebetween.

9. The drum of claim 8, wherein the inner fluid conduit is in fluid communication with the fluid coolant passages and is configured to permit the fluid coolant to exit the fluid coolant passages and return to the second conduit of the fluid delivery assembly.

10. The drum of claim 1, wherein each of the axial channels is a slot formed through the process ring and is open to the radially outer-facing surface.

11. The drum of claim 1, further comprising an outer flange attached to the outer face of the process ring and an inner flange attached to the inner face of the process ring.

12. The drum of claim 1, wherein the thermal coupling gas includes helium.

13. The drum of claim 11, wherein the outer flange and the inner flange both have a first diameter, and the process ring has a second diameter, wherein the first diameter is greater than the second diameter.

14. The drum of claim 13, wherein the first diameter is from about 0.001" to about 0.004" greater than the second diameter.

15. The drum of claim 13, wherein the first diameter is about 0.002" greater than the second diameter.

16. The drum of claim 15, wherein, in operation, when a substrate is wrapped about the drum core and is extended between the outer flange and the inner flange a gap is formed between the substrate and the outer-facing surface that is about 0.001" in depth.

17. The drum of claim 16, wherein the thermal coupling gas is fed to the gap during operation.

18. The drum of claim 1, wherein the first conduit and the second conduit are arranged concentrically along a central axis of the drum core.

* * * * *